United States Patent
Hong et al.

(10) Patent No.: US 8,013,322 B2
(45) Date of Patent: Sep. 6, 2011

(54) LIGHT-EMITTING DIODE DEVICE WITH A DOUBLE-LAYER CONTACT STRUCTURE AND A FABRICATION METHOD THEREOF

(75) Inventors: Ming-Huang Hong, Taichung (TW); Tzong-Liang Tsai, Taichung (TW)

(73) Assignee: Huga Optotech Inc., Taichung (TW)

( * ) Notice: Subject to any disclaimer, the term of this patent is extended or adjusted under 35 U.S.C. 154(b) by 87 days.

(21) Appl. No.: 12/274,239

(22) Filed: Nov. 19, 2008

(65) Prior Publication Data

US 2009/0212276 A1    Aug. 27, 2009

(30) Foreign Application Priority Data

Feb. 21, 2008   (TW) ................................ 97106036 A

(51) Int. Cl.
*H01L 29/06* (2006.01)

(52) U.S. Cl. ...................... 257/13; 438/47; 257/E33.008
(58) Field of Classification Search .................... 257/13, 257/E33.8; 438/47
See application file for complete search history.

(56) References Cited

U.S. PATENT DOCUMENTS

2003/0185265 A1* 10/2003 Henrichs ......................... 372/96
* cited by examiner

*Primary Examiner* — Jami M Valentine
(74) *Attorney, Agent, or Firm* — Birch, Stewart, Kolasch & Birch, LLP

(57) ABSTRACT

The present invention provides a light-emitting diode (LED) device and a fabrication method thereof. The LED device has a double-layered contact layer structure with a surface of one contact layer being patterned to increase ohmic contact area of the double-layered contact layer structure to lower an operation voltage of the LED device, and hence reducing power consumption.

20 Claims, 10 Drawing Sheets

US 8,013,322 B2

LIGHT-EMITTING DIODE DEVICE WITH A DOUBLE-LAYER CONTACT STRUCTURE AND A FABRICATION METHOD THEREOF

BACKGROUND OF THE INVENTION

1. Field of the Invention

The present invention relates to a light-emitting device and a fabrication method thereof, and more particularly to a light-emitting diode and a fabrication method thereof.

2. Description of the Related Art

With reference to FIG. 1, which is a schematic cross-sectional view showing the structure of a conventional light-emitting diode device. The light-emitting diode device 1 includes a substrate 10, a buffer layer 11 on the substrate 10, a first confining layer 12 on the buffer layer 11, an active layer 13 on the first confining layer 12, a second confining layer 14 on the active layer 13, a contact layer 15 on the second confining layer 14, a transparent electrically conductive layer 16 on the contact layer 15 and a set of electrode units 17. The set of electrode units 17 is comprised of a first electrode 17a located on the first confining layer 12 and a second electrode 17b located on the transparent electrically conductive layer 16, which work in coordination to provide the light-emitting diode device 1 with electric energy.

For the above-mentioned structure, the first confining layer 12 has a type of electrically conductivity different from that of the second confining layer 14. For example, the first confining layer 12 and the second confining layer 14 are made of n-type doped and p-type doped gallium nitride (GaN) semiconductor materials, respectively.

The first and second electrodes 17a and 17b of the set of electrode units 17 are made of metals such as gold, chromium and/or the alloy thereof. The first electrode 17a is arranged on the n-typed first confining layer 12, and an ohmic contact therebetween is formed, while the second electrode 17b is arranged on the top face of the transparent electrically conductive layer 16, and an ohmic contact thereof is formed with the contact layer 15, so as to provide the n-typed first confining layer 12 and the p-typed second confining layer 14 with electric energy.

While the electric energy is applied to the light-emitting diode device 1 through the first and second electrodes 17a and 17b, the current will pass through the n-typed first confining layer 12 and the p-typed second confining layer 14. The current flowing from the second electrode 17b into the light-emitting diode device 1 is uniformly distributed whereby the electron and the hole are combined within the active layer 13 so that the energy is released and converted into light energy for light-emitting. The active layer 13 has a structure of multi-quantum wells including a plurality of barrier layers 13a and plural layers of quantum well 13b which are stacked on each other.

In order to enhance the light-extraction efficiency of the light-emitting diode device 1, the p-typed second confining layer 14 and the contact layer 15 are patterned to form a plurality of openings therein, so as to enable a sufficient contact of the second electrode 17b with the p-typed second confining layer 14 and the contact layer 15. In this case, the lighting brightness of the light-emitting diode device 1 can be increased.

Nevertheless, the working voltage of the patterned p-typed second confining layer 14 is relatively increased as well. In view of this, an improved structure for the light-emitting diode device and the fabrication method thereof are provided in the present invention, by which not only the issue relating to the increased working voltage is addressed but the fabrication process therefor is simplified and the product cost thereof is reduced.

SUMMARY OF THE INVENTION

One object of the present invention is to provide a light-emitting diode (LED).

Moreover, a further object of the present invention is to provide a fabrication method for an LED.

According to an aspect of the present invention, the provided LED device includes a substrate; a buffer layer on the substrate; a confining layer of a first type of electrical conductivity on the buffer layer; an active layer on the confining layer; a first confining layer of a second type of electrical conductivity on the active layer; a first electrically conductive contact layer on the first confining layer; a second confining layer of the second type of electrical conductivity patterned and located on the first electrically conductive contact layer; a second electrically conductive contact layer patterned and located on the second confining layer; a transparent electrically conductive layer on the second electrically conductive contact layer, the transparent electrically conductive layer having a plurality of contacts passing through the second electrically conductive layer and the second confining layer to electrically contact with the first electrically conductive contact layer; a first electrically conductive electrode on the confining layer; and a second electrically conductive electrode on the transparent electrically conductive layer.

According to a further aspect of the present invention, the provided LED device includes a substrate; a buffer layer on the substrate; a confining layer of a first type of electrical conductivity on the buffer layer; an active layer on the confining layer; a first confining layer of a second type of electrical conductivity on the active layer; a first electrically conductive contact layer on the first confining layer; a second confining layer of the second electrical conductivity patterned and located on the first electrically conductive contact layer; a second electrically conductive contact layer patterned and located on the second confining layer; a transparent electrically conductive layer on the second electrically conductive contact layer, the transparent electrically conductive layer having a plurality of first contacts passing through the second electrically conductive contact layer and the second confining layer to electrically contact with the first electrically conductive contact layer; a first electrically conductive electrode on the first confining layer; and a second electrically conductive electrode on the transparent electrically conductive layer, the second electrically conductive electrode having a plurality of second contacts passing through the transparent electrically conductive electrode and the second confining layer to electrically contact with the first electrically conductive contact layer.

Preferably, the first electrically conductive contact layer and the second electrically conductive contact layer have a respective thickness of less than 50 nm.

Preferably, the first electrically conductive contact layer and the second electrically conductive contact layer have a respective thickness of less than 10 nm.

Preferably, the first electrically conductive contact layer and the second electrically conductive contact layer have a respective thickness of about 3 nm.

Preferably, the light-emitting diode device is a gallium nitride (GaN) based light-emitting diode device.

Preferably the first electrically conductive contact layer and the second electrically conductive contact layer are selected from any one of the following materials: heavy-doped $P^{++}$-type or $N^{++}$-type nitrides of group IIIA, heavy-doped $P^{++}$-type or $N^{++}$-type materials of group IIA-VA having an element of group IIA selected from beryllium (Be), magnesium (Mg) and calcium (Ca) and an element of group VA selected from nitrogen (N), arsenic (As), phosphorous (P) and antimony (Sb), and heavy-doped $P^{++}$-type or $N^{++}$-type materials of group IIA-VIA having an element of group VIA selected from oxygen (O), sulfur (S), selenium (Se), tellurium (Te) and polonium (Po).

Preferably, the active layer has a structure of multi-quantum wells.

Preferably, the first electrically conductive contact layer and the second electrically conductive contact layer have the first type of electrical conductivity or the second type of electrical conductivity.

According to still another aspect of the present invention, the provided fabrication method for an LED includes the steps of: forming a buffer layer on a substrate; forming a confining layer of a first type of electrical conductivity on the buffer layer; forming an active layer on the first confining layer; forming a first confining layer of a second type of electrical conductivity on the active layer; forming a first electrically conductive contact layer on the first confining layer; forming a second confining layer of the second type of electrical conductivity on the first electrically conductive contact layer; forming a second electrically conductive contact layer on the second confining layer; removing a portion of the second electrically conductive contact layer, second confining layer, the first electrically conductive contact layer, the first confining layer, the active layer and the confining layer, so as to form a mesa on the confining layer; forming a first electrically conductive electrode on the mesa of the confining layer; forming a plurality of first openings passing through the second electrically conductive contact layer and the second confining layer to make a portion of the first electrically conductive contact layer exposed; forming a transparent electrically conductive layer on the second electrically conductive contact layer; and forming a second electrically conductive contact layer on the transparent electrically conductive contact layer.

Preferably, the provided fabrication method further includes the step of forming a plurality of second openings passing through the transparent electrically conductive layer, the second electrically conductive contact layer and the second confining layer to make a portion of the first electrically conductive contact layer exposed after forming the transparent electrically conductive layer.

In the fabrication method according to the present invention, the second confining layer and the second electrically conductive contact layer are patterned in such a way that the plurality of openings are formed therein so as to expose the first electrically conductive contact layer.

Preferably, the transparent electrically conductive layer is located above the second electrically conductive layer and has a plurality of contacts to the second electrically conductive layer and the second confining layer, so as to establish the electrical contacts to the first electrically conductive layer.

Preferably, the electrodes are separately arranged from each other, and are respectively ohmically contacted with the two confining layers of different electrical conductivities, so as to provide the two confining layers with the electric energy to cause the electron-hole combination, release the energy, and convert the energy into the light energy within the active layer as well.

Preferably, the first electrically conductive contact layer and the second electrically conductive contact layer have a respective thickness of less than 50 nm. More preferably, the thickness is less than 10 nm, and the most preferably, the first electrically conductive contact layer and the second electrically conductive contact layer have a respective thickness of less than 3 nm.

Preferably, the light-emitting diode device is a gallium nitride (GaN) based light-emitting diode device, wherein the first and the second electrically conductive contact layers are made of a material selected from gallium indium nitride, divalent phosphorous doped gallium nitride and divalent nitrogen doped gallium nitride.

Preferably, the active layer has a structure of multi-quantum wells, and the first electrically conductive contact layer and the second electrically conductive contact layer have the first type of electrical conductivity or the second type of electrical conductivity.

In the present invention, the area of ohmic contact of the contact layer is increased owing to a double-layered structure thereof which is formed by the arrangement of a further contact layer in the LED device, so that the working voltage of the LED can be lowered according to the present invention.

DETAILED DESCRIPTION OF THE PREFERRED EMBODIMENTS

Figure 1:
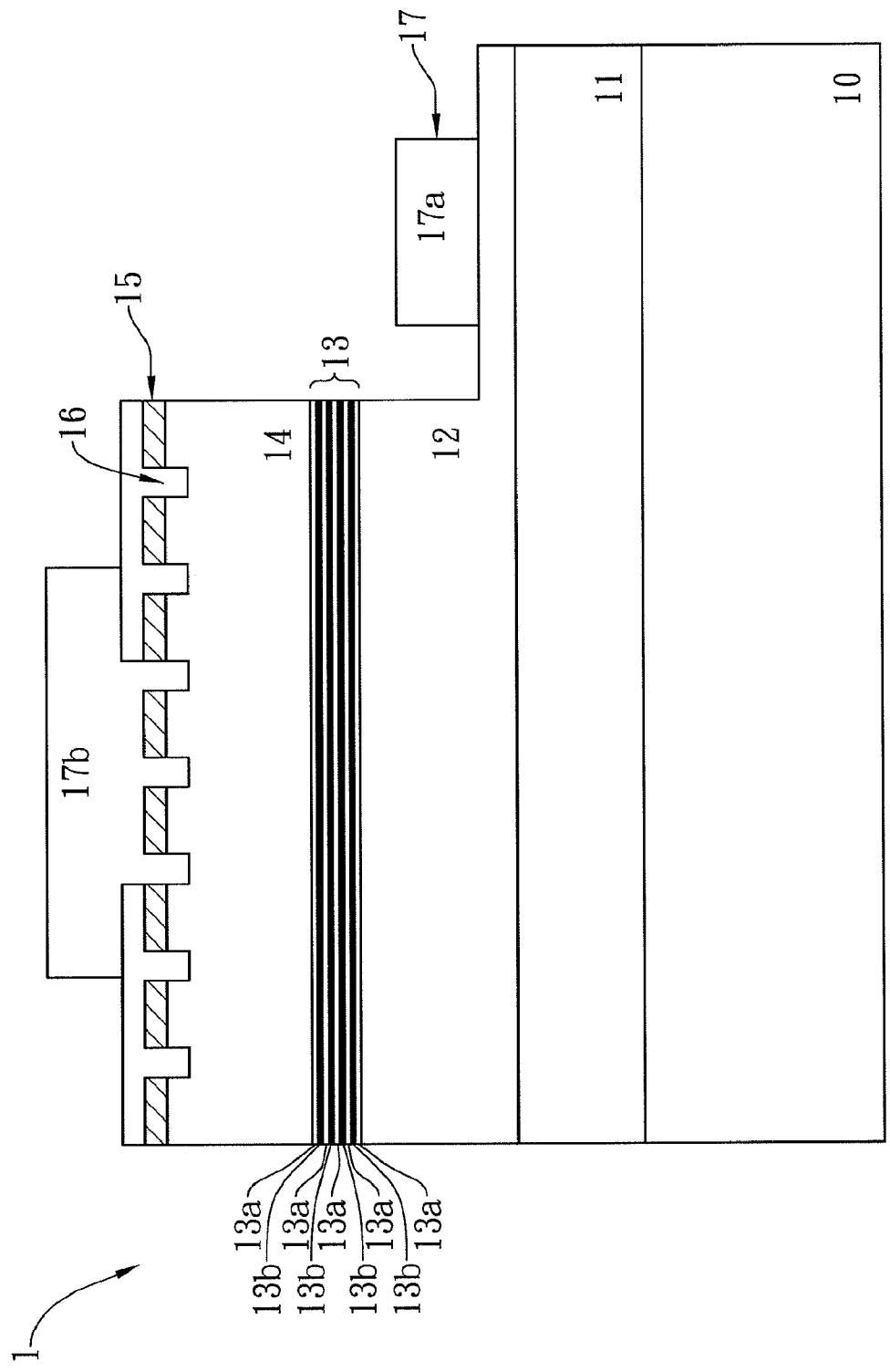
FIG. 1 is a schematic cross-sectional view showing the structure of a conventional light-emitting diode device.

With reference to the following disclosures combined with the accompanying drawings, the light-emitting diode device and the fabrication method thereof according to the present invention are illustrated and understood.

It should be noted that in the following descriptions and the accompanying drawings, similar elements are indicated by the same reference numeral.

With reference to FIGS. 2A to 2D, the structure of the light-emitting diode device corresponding to various stages of the fabrication method thereof according to a preferred embodiment of the present invention is illustrated.

Figure 2A:
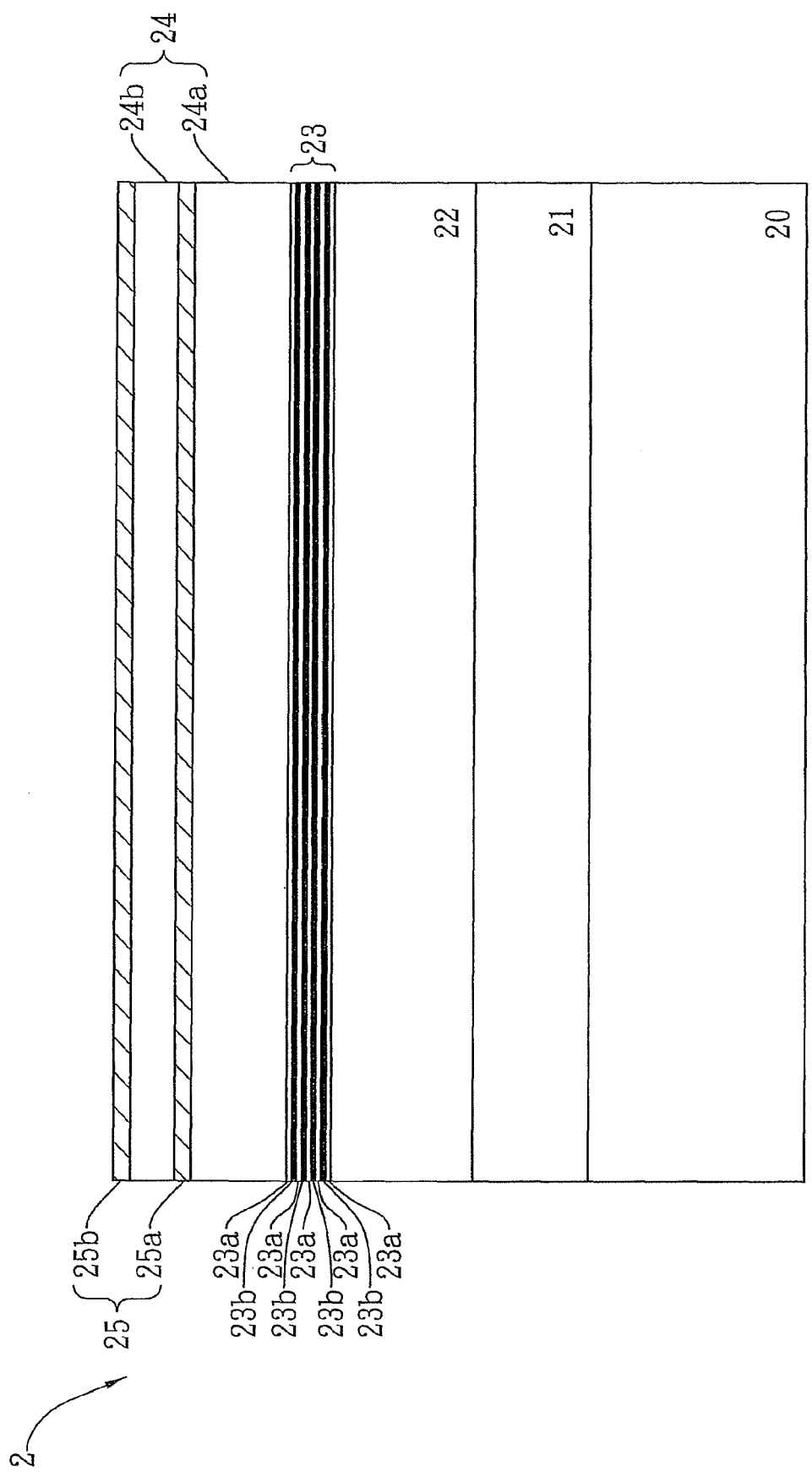
FIGS. 2A to 2D are schematic cross-sectional views corresponding to various stages of a method for forming a light-emitting diode device according to a preferred embodiment of the present invention.

As shown in FIG. 2A, a buffer layer 21 made of gallium nitride based material is provided on the substrate 20 by means of any known method in this art, and thereon the gallium nitride based semiconductor material is formed. That is, on the buffer layer 21, the confining layer of a first type of electrical conductivity 22, the active layer 23, the first confining layer of a second type of electrical conductivity 24a, a first electrically conductive contact layer 25a, a second confining layer of the second type of electrical conductivity 24b and a second electrically conductive layer 25b are formed in sequence. According to a preferred embodiment of the present invention, the active layer 23 has a structure of multi-quantum wells constructed by plural barrier layers 23a and plural quantum well layers 23b, which are mutually stacked on each other. The material and composition of respective quantum well layers 23b can be identical or not. The confining layer of the first type of electrical conductivity 22 is doped and exhibits an n-typed electrical conductivity, which is thus termed as an n-typed confining layer. The first and second confining layers of the second type of electrical conductivity 24a and 24b are doped and exhibit a p-typed electrical conductivity, which are respectively termed as a first p-typed confining layer and a second p-typed confining layer.

Figure 2B:
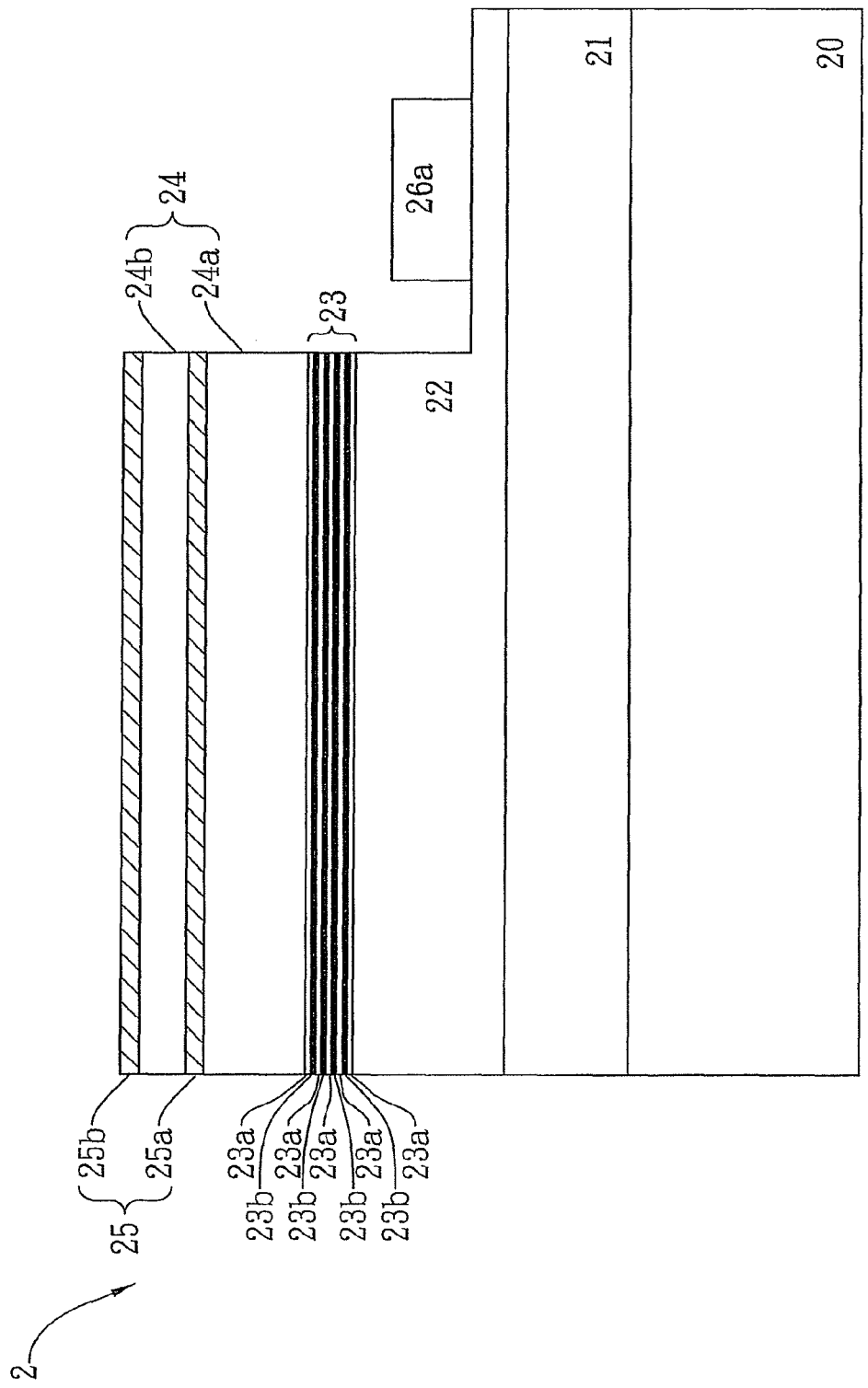

After forming the mentioned structure, the step of FIG. 2B is carried out to form the first electrode of the light-emitting diode device. First, a portion of the second electrically conductive contact layer 25b, second confining layer 24b, first electrically conductive contact layer 25a, first confining layer 24a, active layer 23 and the confining layer 22 is removed so as to form the so-called mesa.

Figure 2C:
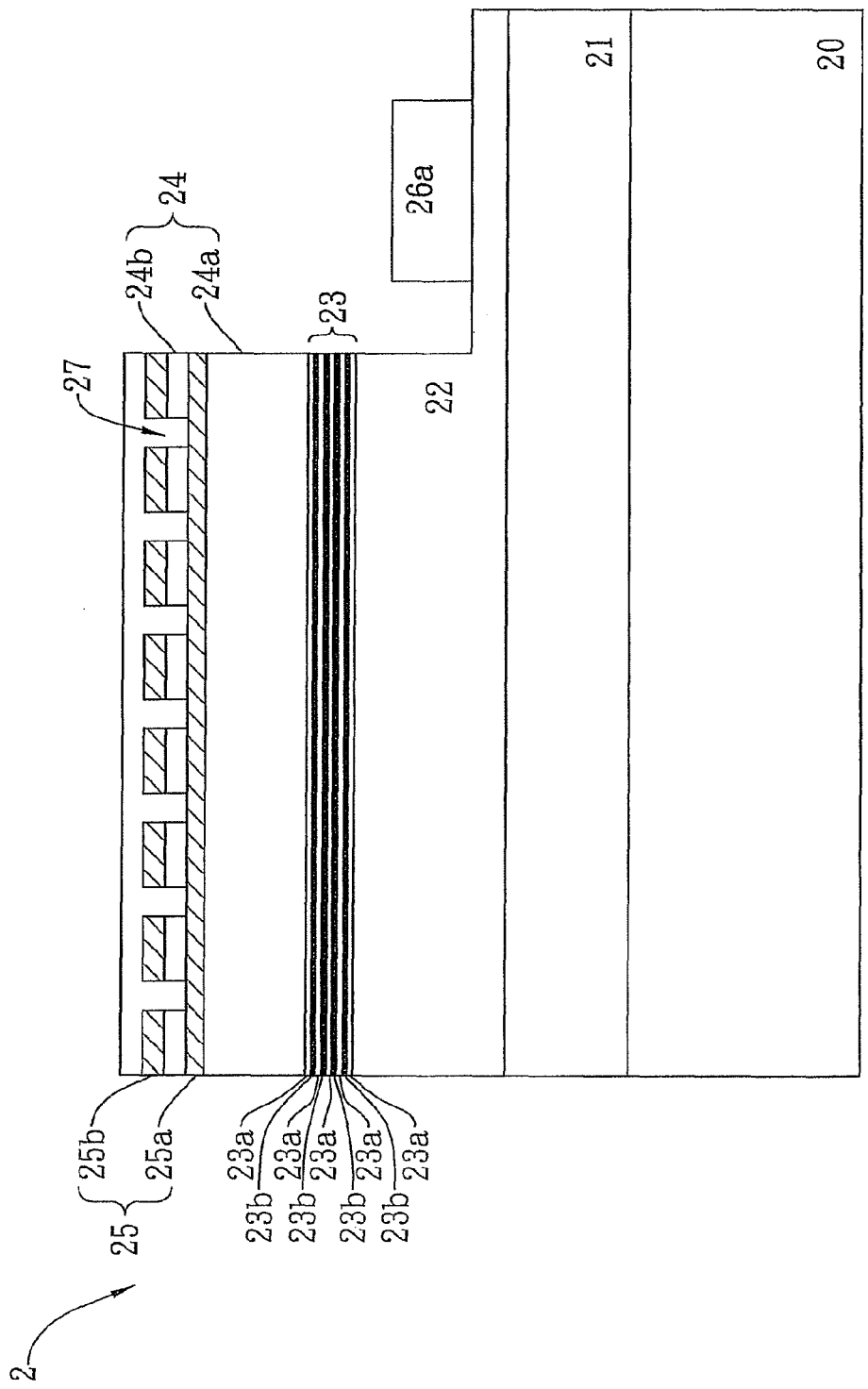
Figure 2D:
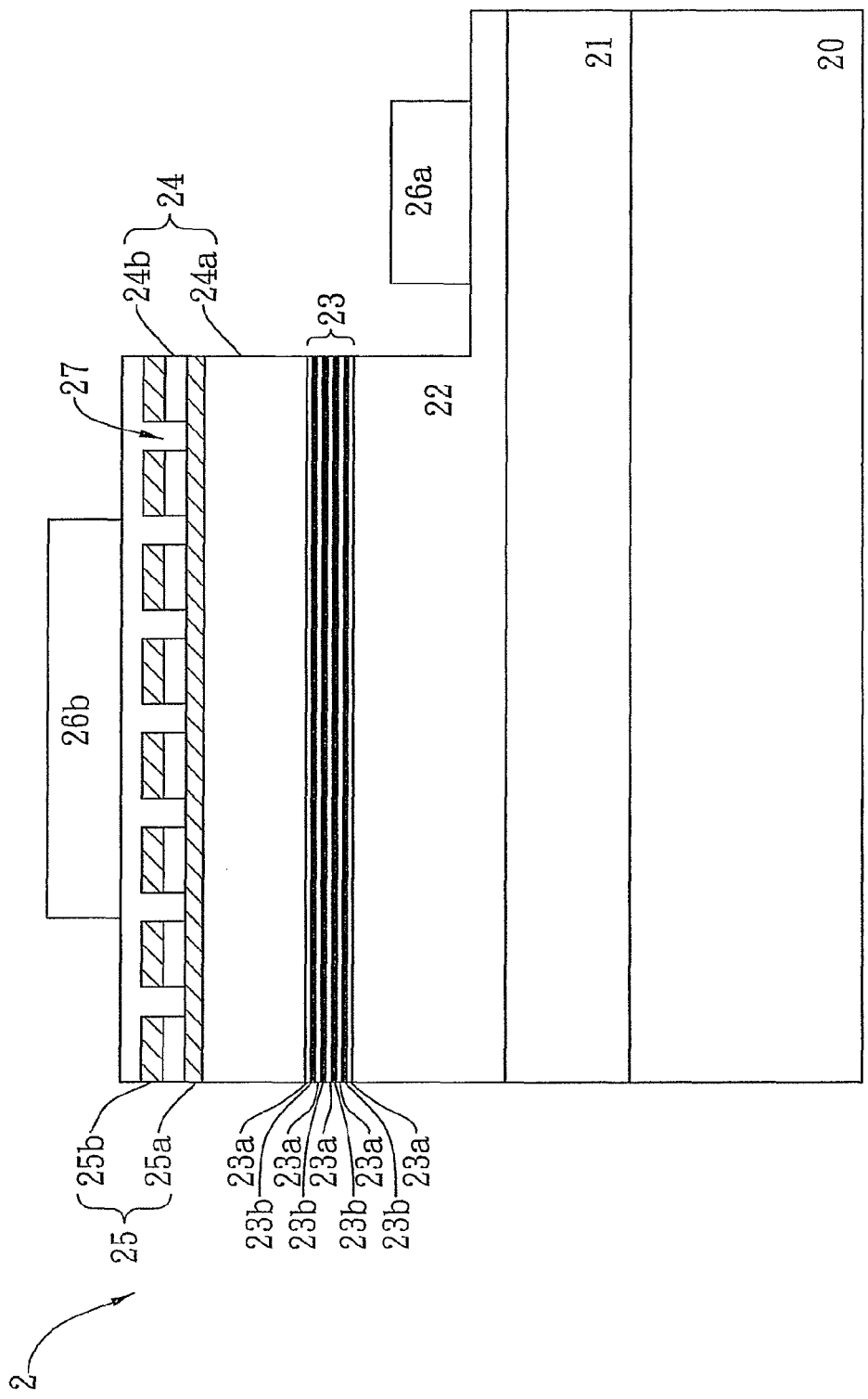

Then, the second electrically conductive contact layer 25b and the second p-typed confining layer 24b are patterned by means of wet-etching, inductively coupled plasma (ICP) etching or photoelectrochemical (PEC) etching so as to form a plurality of openings therein and to expose the electrically conductive contact layer 25a. Subsequently, the transparent electrically conductive layer 27 is formed on the patterned second electrically conductive contact layer 25b and fills the recess and thus contacts to the second electrically conductive contact layer 25b and the second p-typed confining layer 24b, as shown in FIG. 2C. The transparent electrically conductive contact layer 27 can be a layer of indium tin oxide (ITO).

After the transparent electrically conductive layer 27 is formed, an electrode of a first type of electrically conductivity 26a is further formed thereon. The electrode 26a is an n-typed electrode which is ohmically contacted to the confining layer 22. The light-emitting diode device 2 of the present invention is thus fabricated. In this preferred embodiment, the first electrically conductive contact layer 25a and the second electrically conductive contact layer 25b can be an $N^{++}$-typed contact layer or a $P^{++}$-typed contact layer having a dopant concentration ranged in $1E17/cm^3$ to $5E22/cm^3$. The thickness of the respective first electrically conductive contact layer 25a and second electrically conductive contact layer 25b is less than 50 nm, and is preferably less than 10 nm. In a most preferred embodiment, the thickness of the respective first electrically conductive contact layer 25a and second electrically conductive contact layer 25b is less than 3 nm. Moreover, in this preferred embodiment, the first type of electrical conductivity is n-typed and the second type is p-typed for illustration. Nevertheless, the types of electrical conductivities of the light-emitting diode device 2 can be interchanged.

Figure 3A:
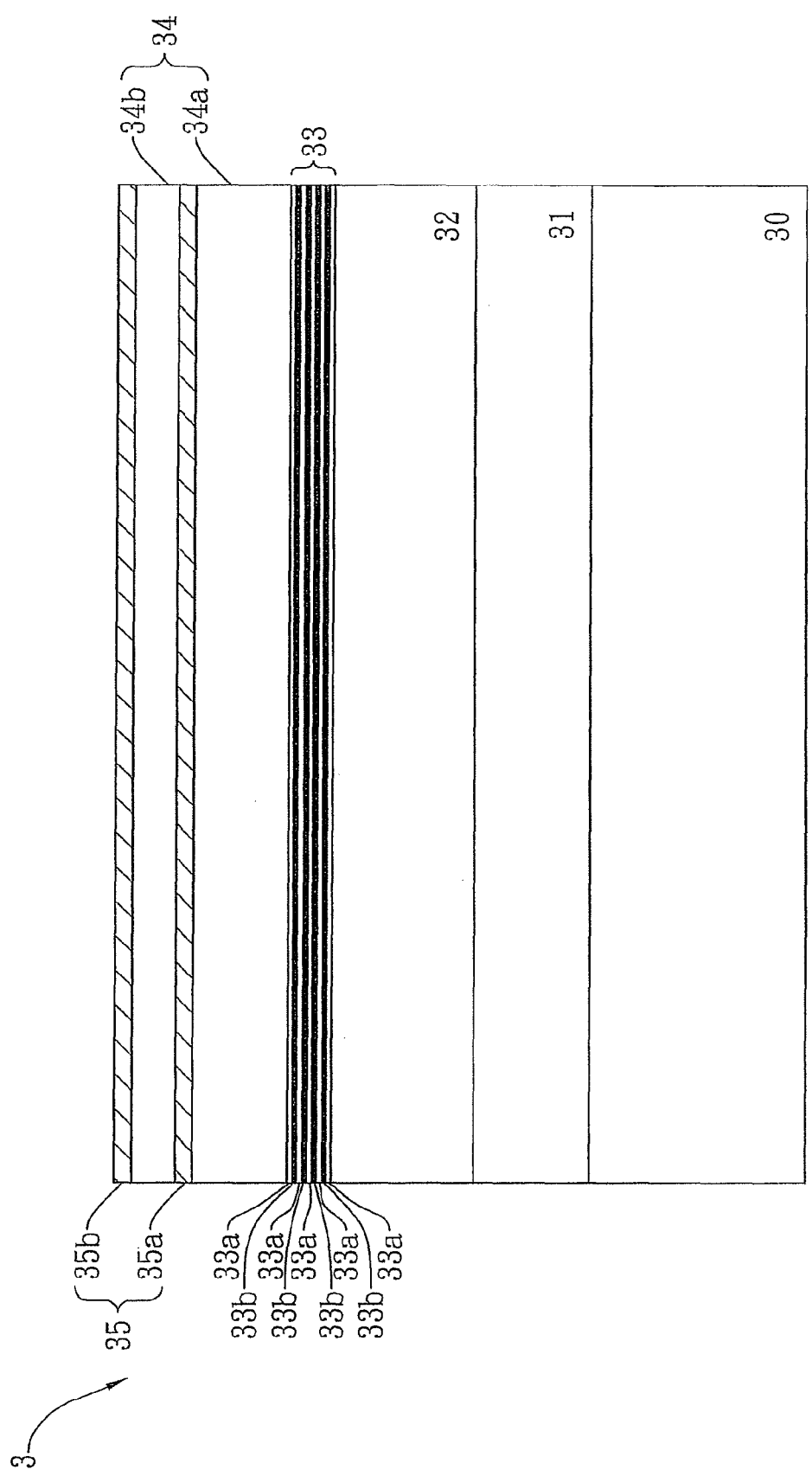
FIGS. 3A to 3E are schematic cross-sectional views corresponding to various stages of a method for forming a light-emitting diode device according to a further preferred embodiment of the present invention.
Figure 3B:
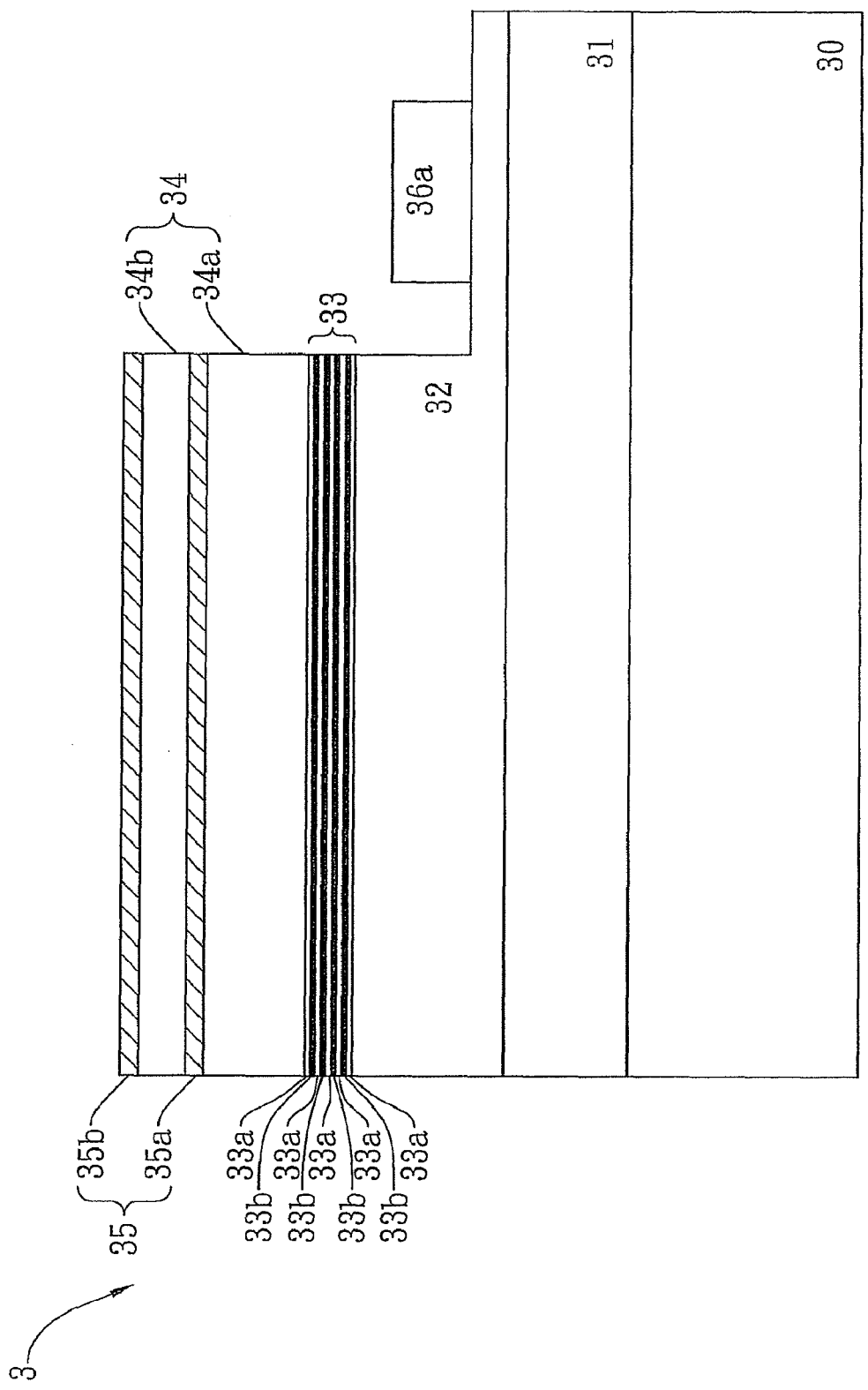
Figure 3C:
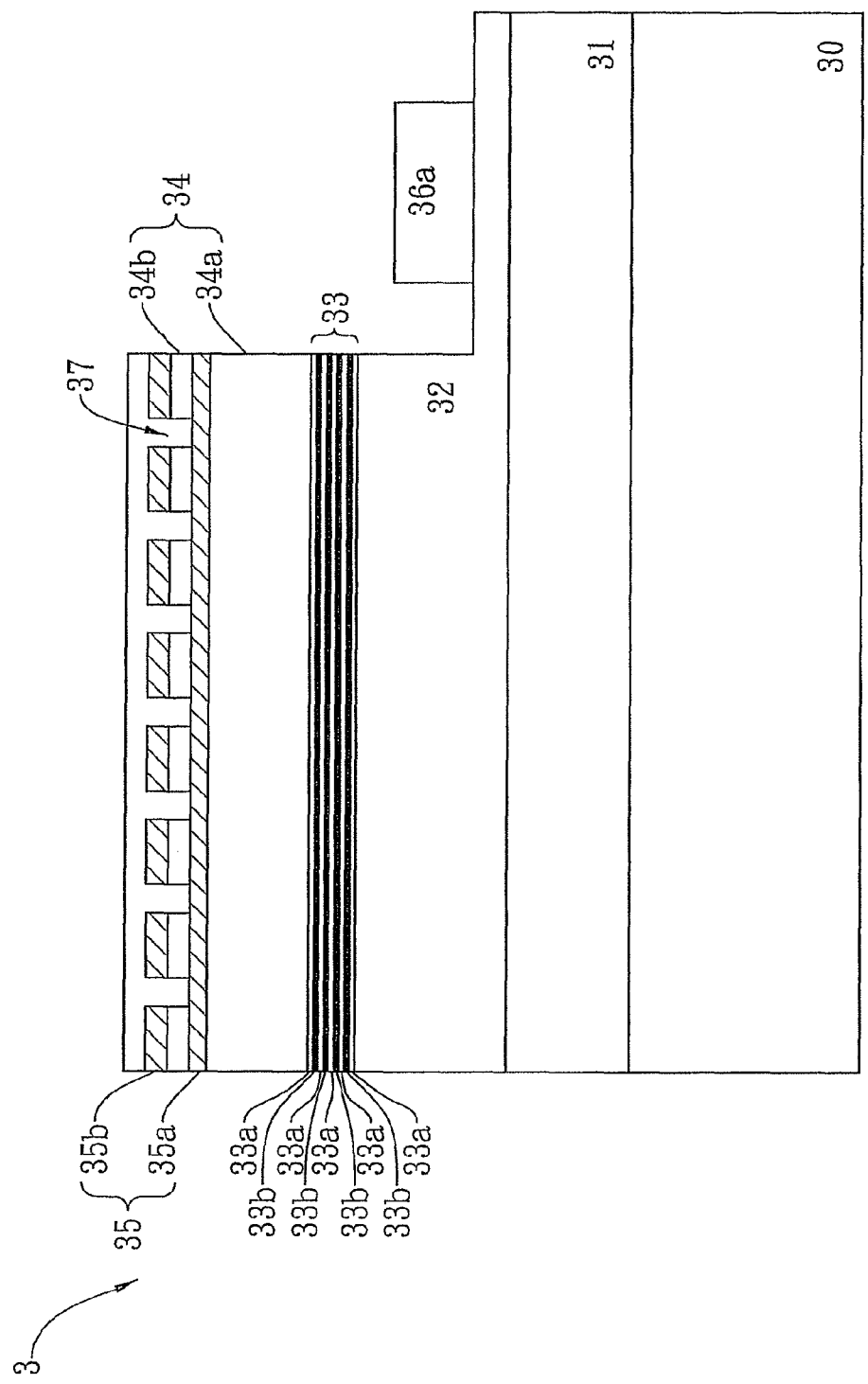

With reference to FIGS. 3A to 3E, the structure of the light-emitting diode device corresponding to various stages of the fabrication method thereof according to a preferred embodiment of the present invention is illustrated. In this embodiment, the front portion of the stages of fabrication method for the light-emitting diode device 3, as shown in FIGS. 3A to 3C, is the same as that of the prior embodiment. In other words, in this embodiment, a buffer layer 31 made of gallium nitride based material is also provided on the substrate 30 by means of any known method in this art, and thereon a layer sequence of gallium nitride based semiconductor material including a confining layer of a first type of electrical conductivity 32, an active layer 33, a first confining layer of a second type of electrical conductivity 34a, a first electrically conductive contact layer 35a, a second confining layer of the second type of electrical conductivity 34b and a second electrically conductive layer 35b is formed, wherein the active layer 33 has a structure of multi-quantum wells constructed by plural barrier layers 33a and plural quantum well layers 33b, which are mutually stacked on each other. The material and composition of respective quantum well layers 33b can be identical or not. The confining layer of the first type of electrical conductivity 32 is doped and exhibits an n-typed electrical conductivity, which is thus termed as an n-typed confining layer. The first and second confining layers of the second type of electrical conductivity 34a and 34b are doped and exhibit a p-typed electrical conductivity, which are respectively termed as a first p-typed confining layer and a second p-typed confining layer, as shown in FIG. 3A.

After forming the mentioned structure, the step of FIG. 3B is carried out to form the first electrode of the light-emitting diode device. First, a portion of the second electrically conductive contact layer 35b, second confining layer 34b, first electrically conductive contact layer 35a, first confining layer 34a, active layer 33 and the confining layer 32 is removed so as to form the so-called mesa.

Then, the second electrically conductive contact layer 35b and the second p-typed confining layer 34b are patterned by means of wet-etching, inductively coupled plasma (ICP) etching or photoelectrochemical (PEC) etching so as to form a plurality of openings therein and to expose the electrically conductive contact layer 35a. Subsequently, the transparent electrically conductive layer 37 is formed on the patterned second electrically conductive contact layer 35b and fills the recess and thus contacts to the second electrically conductive contact layer 35b and the second p-typed confining layer 34b, as shown in FIG. 3C.

Figure 3D:
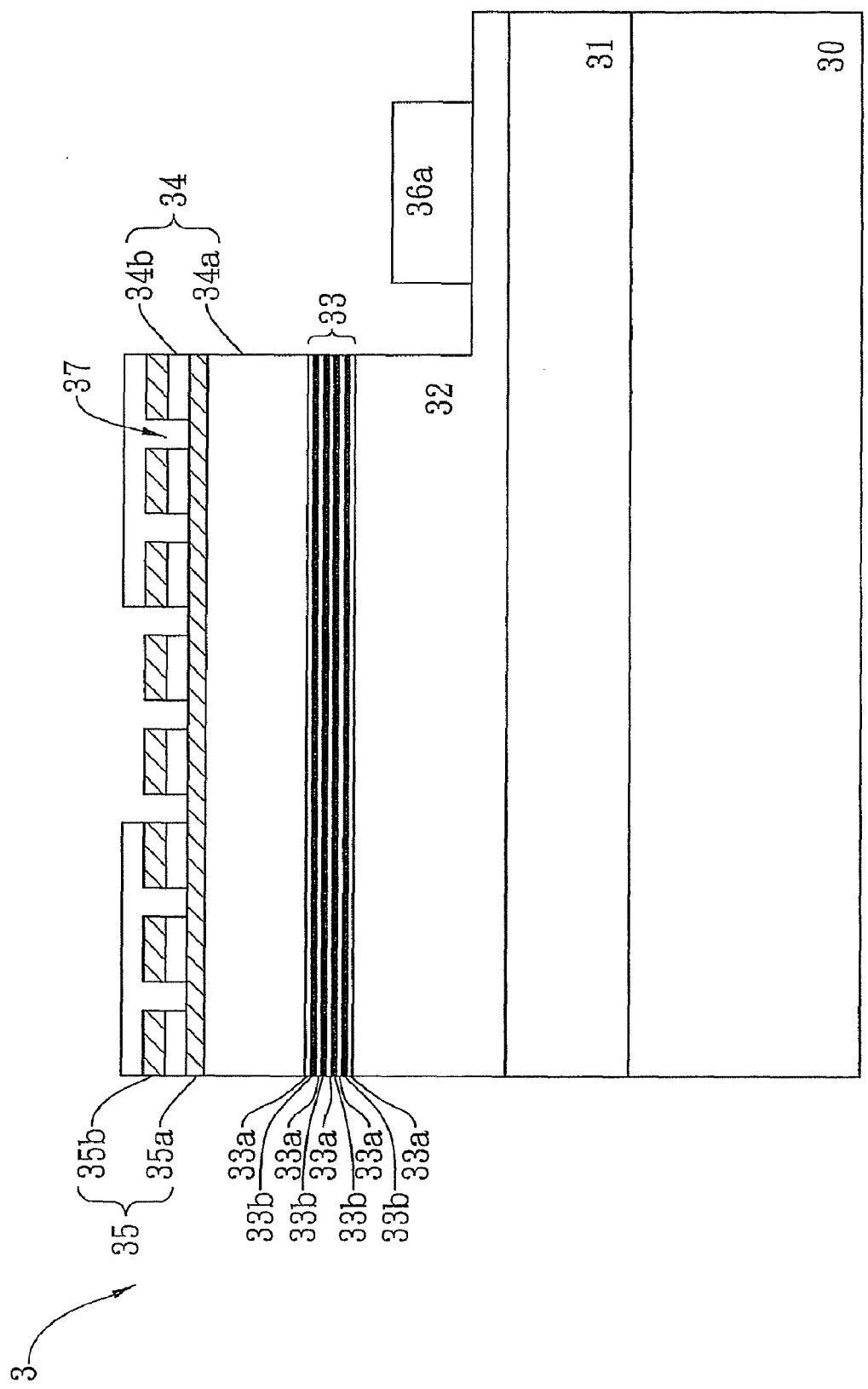

This embodiment is different from the prior one in that, after forming the transparent electrically conductive layer 37, a portion of the transparent electrically conductive layer 37, second electrically conductive contact layer 35b and second p-typed confining layer 34b is patterned by etching again, so as to form a plurality of openings therein for exposing the first electrically conductive contact layer 35a, as shown in FIG. 3D.

Figure 3E:
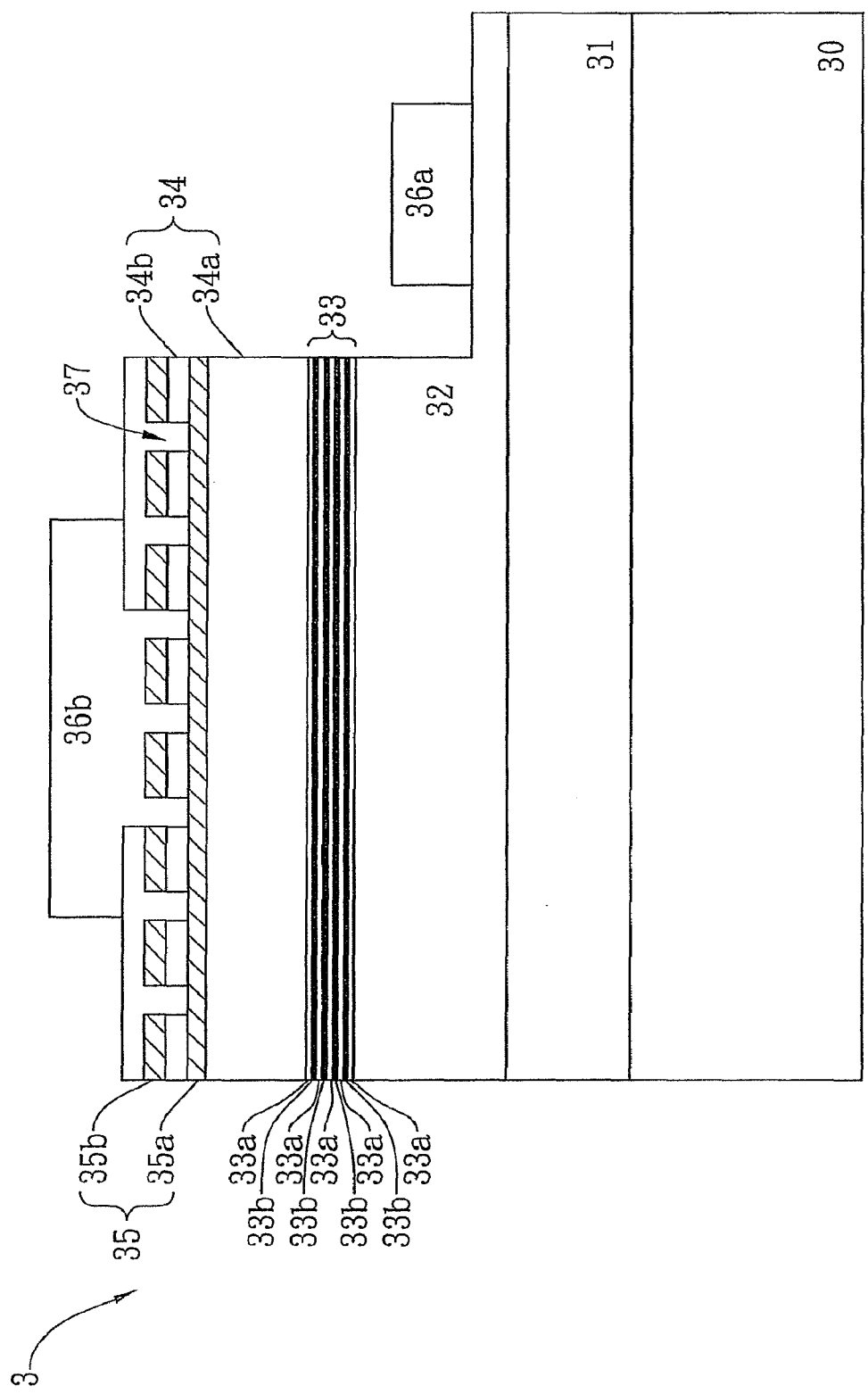

When the second etching is completed, a second electrode 36b is formed within the transparent electrically conductive layer 37 and fills into the mentioned openings and thus ohmically contacts to the transparent electrically conductive layer 37, the second electrically conductive contact layer 35b and the second p-typed confining layer 34b, so that the light-emitting diode device 3 is fabricated, as shown in FIG. 3E.

In the present invention, the substrates 20, 30 of the respective light-emitting diode devices 2, 3 are made of sapphire. In order to improve the lattice matching between the semiconductor material of gallium nitride and the substrate, a respective GaN buffer layer 21, 31 is grown on the substrate 20, before the confining layers 22, 24, 32 and 34 are grown thereon. In this case, the film defect resulting from the mismatch of lattice can be avoided.

The confining layers 22, 24, 32 and 34 are made of gallium indium nitride, and are respectively doped with the dopant combination of divalent phosphorous and divalent nitrogen so as to exhibit two different types of electrical conductivities. In this embodiment, the first confining layers 22, 32 are n-typed while the second confining layers 24, 34 are p-typed, and vice versa.

The first electrodes 26a, 36a and the second electrodes 26b, 36b are made of such as gold, chromium and/or the alloy thereof. The first electrodes 26a, 36a are configured to form an ohmic contact with the n-typed confining layers 21, 31, and are thus termed as n-typed electrodes, while the second electrodes 26b, 36b are configured to form an ohmic contact with the p-typed confining layers 24, 34, and are thus termed as p-typed electrodes. By applying a voltage through the n-typed electrodes 26a, 36a and the p-typed electrodes 26b, 36b, the current can pass through the n-typed confining layers 21, 31 and the p-typed confining layers 24, 34, and thereby the electrons and holes are combined within the active layer and thus results in the light energy.

In the present invention, the second electrically conductive contact layers 25b, 35b and the second p-typed confining layers 24b, 34b are patterned to create a plurality of openings therein. Preferably, the transparent electrically conductive layers 27, 37, the second electrically conductive contact layers 25b, 35b and the second p-typed confining layers 24b, 34b are patterned and thus define a plurality of openings therein, so that the first electrically conductive contact layers 25a, 35a can be exposed, and the contact area between the contact layers 25, 35 and the second electrodes 26b, 36b is significantly increased. In this case, the efficient current is enlarged, which is sufficient to maintain the low working voltage of the light-emitting diode device 2, 3 of the present invention. In comparison with the conventional light-emitting diode device 1 in this art, which has only one contact layer therein, the light-emitting diode device and the fabrication method thereof according to the present invention are advantageous in an increased efficiency in light-emitting and a reduced working voltage of the light-emitting diode device.

While the invention has been described by way of examples and in terms of preferred embodiments, it is to be understood that various changes, substitutions, and alterations can be made herein without departing from the spirit and scope of the invention as defined by the appended claims.

What is claimed is:

1. A light-emitting diode device, comprising:
    a substrate;
    a buffer layer on said substrate;
    a confining layer of a first type of electrical conductivity on said buffer layer;
    an active layer on said confining layer;
    a first confining layer of a second type of electrical conductivity on said active layer;
    a first electrically conductive contact layer on said first confining layer;
    a second confining layer of said second type of electrical conductivity patterned and located on said first electrically conductive contact layer;
    a second electrically conductive contact layer patterned and located on said second confining layer;
    a transparent electrically conductive layer on said second electrically conductive contact layer, said transparent electrically conductive layer having a plurality of contacts passing through said second electrically conductive layer and said second confining layer to electrically contact with said first electrically conductive contact layer;
    a first electrically conductive electrode on said confining layer; and
    a second electrically conductive electrode on said transparent electrically conductive layer,
    wherein said first electrically conductive contact layer and said second electrically conductive contact layer are selected from any one of the following materials: heavy-doped P$^{++}$-type or N$^{++}$-type nitrides of group IIIA, heavy-doped P$^{++}$-type or N$^{++}$-type materials of group IIA-VA having an element of group IIA selected from beryllium (Be), magnesium (Mg) and calcium (Ca) and an element of group VA selected from nitrogen (N), arsenic (As), phosphorous (P) and antimony (Sb), and heavy-doped P$^{++}$-type or N$^{++}$-type materials of group IIA-VIA having an element of group VIA selected from oxygen (O), sulfur (S), selenium (Se), tellurium (Te) and polonium (Po).

2. The light-emitting diode device of claim 1, wherein said first electrically conductive contact layer and said second electrically conductive contact layer have a respective thickness of less than 50 nm.

3. The light-emitting diode device of claim 1, wherein said first electrically conductive contact layer and said second electrically conductive contact layer have a respective thickness of less than 10 nm.

4. The light-emitting diode device of claim 1, wherein said first electrically conductive contact layer and said second electrically conductive contact layer have a respective thickness of about 3 nm.

5. The light-emitting diode device of claim 1, wherein said light-emitting diode device is a gallium nitride (GaN) based light-emitting diode device.

6. The light-emitting diode device of claim 1, wherein said active layer has a structure of multi-quantum wells.

7. The light-emitting diode device of claim 1, wherein said first electrically conductive contact layer and said second electrically conductive contact layer have said first type of electrical conductivity or said second type of electrical conductivity.

8. A light-emitting diode device, comprising:
    a substrate;
    a buffer layer on said substrate;
    a confining layer of a first type of electrical conductivity on said buffer layer;
    an active layer on said confining layer;
    a first confining layer of a second type of electrical conductivity on said active layer;
    a first electrically conductive contact layer on said first confining layer;
    a second confining layer of said second electrical conductivity patterned and located on said first electrically conductive contact layer;
    a second electrically conductive contact layer patterned and located on said second confining layer;
    a transparent electrically conductive layer on said second electrically conductive contact layer, said transparent electrically conductive layer having a plurality of first contacts passing through said second electrically conductive contact layer and said second confining layer to electrically contact with said first electrically conductive contact layer;
    a first electrically conductive electrode on said first confining layer; and
    a second electrically conductive electrode on said transparent electrically conductive layer, said second electrically conductive electrode having a plurality of second contacts passing through said transparent electrically conductive layer and said second confining layer to electrically contact with said first electrically conductive contact layer,
    wherein said first electrically conductive contact layer and said second electrically conductive contact layer are selected from any one of the following materials: heavy-doped P$^{++}$-type or N$^{++}$-type nitrides of group IIIA, heavy-doped P$^{++}$-type or N$^{++}$-type materials of group IIA-VA having an element of group IIA selected from beryllium (Be), magnesium (Mg) and calcium (Ca) and an element of group VA selected from nitrogen (N), arsenic (As), phosphorous (P) and antimony (Sb), and heavy-doped P$^{++}$-type or N$^{++}$-type materials of group IIA-VIA having an element of group VIA selected from oxygen (O), sulfur (S), selenium (Se), tellurium (Te) and polonium (Po).

9. The light-emitting diode device of claim 8, wherein said first electrically conductive contact layer and said second electrically conductive contact layer have a respective thickness of less than 50 nm.

10. The light-emitting diode device of claim 8, wherein said first electrically conductive contact layer and said second electrically conductive contact layer have a respective thickness of less than 10 nm.

11. The light-emitting diode device of claim 8, wherein said first electrically conductive contact layer and said second electrically conductive contact layer have a respective thickness of about 3 nm.

12. The light-emitting diode device of claim 8, wherein said light-emitting diode device is a gallium nitride (GaN) based light-emitting diode device.

13. The light-emitting diode device of claim 8, wherein said active layer has a structure of multi-quantum well.

14. The light-emitting diode device of claim 8, wherein said first electrically conductive contact layer and said second electrically conductive contact layer have said first type of electrical conductivity or said second type of electrical conductivity.

15. A method for fabricating a light-emitting diode device, comprising:
   forming a buffer layer on a substrate;
   forming a confining layer of a first type of electrical conductivity on said buffer layer;
   forming an active layer on said confining layer;
   forming a first confining layer of a second type of electrical conductivity on said active layer;
   forming a first electrically conductive contact layer on said first confining layer;
   forming a second confining layer of said second type of electrical conductivity on said first electrically conductive contact layer;
   forming a second electrically conductive contact layer on said second confining layer;
   removing a portion of said second electrically conductive contact layer, second confining layer, said first electrically conductive contact layer, said first confining layer, said active layer and said confining layer, so as to form a mesa on said confining layer;
   forming a first electrically conductive electrode on said mesa of said confining layer;
   forming a plurality of first openings passing through said second electrically conductive contact layer and said second confining layer to make a portion of said first electrically conductive contact layer exposed;
   forming a transparent electrically conductive layer on said second electrically conductive contact layer, said transparent electrically conductive layer having a plurality of contacts passing through said second electrically conductive layer and said second confining layer to electrically contact with said first electrically conductive contact layer; and
   forming a second electrically conductive electrode on said transparent electrically conductive contact layer,
   wherein said first electrically conductive contact layer and said second electrically conductive contact layer are selected from any one of the following materials: heavy-doped $P^{++}$-type or $N^{++}$-type nitrides of group IIIA, heavy-doped $P^{++}$-type or $N^{++}$-type materials of group IIA-VA having an element of group IIA selected from beryllium (Be), magnesium (Mg) and calcium (Ca) and an element of group VA selected from nitrogen (N), arsenic (As), phosphorous (P) and antimony (Sb), and heavy-doped P-type or $N^{++}$-type materials of group IIA-VIA having an element of group VIA selected from oxygen (O), sulfur (S), selenium (Se), tellurium (Te) and polonium (Po).

16. The method for fabricating a light-emitting diode device of claim 15, wherein said active layer has a structure of multi-quantum wells.

17. The method for fabricating a light-emitting diode device of claim 15, wherein said first electrically conductive contact layer and said second electrically conductive contact layer have a respective thickness of less than 50 nm.

18. The method for fabricating a light-emitting diode device of claim 15, wherein said first electrically conductive contact layer and said second electrically conductive contact layer have a respective thickness of less than 10 nm.

19. The method for fabricating a light-emitting diode device of claim 15, wherein said first electrically conductive contact layer and said second electrically conductive contact layer have a respective thickness of about 3 nm.

20. The method for fabricating a light-emitting diode device of claim 15, further comprising forming a plurality of second openings passing through said transparent electrically conductive layer, said second electrically conductive contact layer and said second confining layer to make a portion of said first electrically conductive contact layer exposed after forming said transparent electrically conductive layer.

\* \* \* \* \*